US009013101B2

(12) United States Patent
Kim

(10) Patent No.: US 9,013,101 B2
(45) Date of Patent: Apr. 21, 2015

(54) DISPLAY APPARATUS AND METHOD OF MANUFACTURING THE SAME

(71) Applicant: Samsung Display Co., Ltd., Yongin (KR)

(72) Inventor: Kil-Joo Kim, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/223,522

(22) Filed: Mar. 24, 2014

(65) Prior Publication Data

US 2015/0015138 A1 Jan. 15, 2015

(30) Foreign Application Priority Data

Jul. 9, 2013 (KR) ........................ 10-2013-0080551

(51) Int. Cl.
*H05B 33/04* (2006.01)
(52) U.S. Cl.
CPC ..................................... *H05B 33/04* (2013.01)
(58) Field of Classification Search
CPC ............ H01L 51/5237; H01L 51/5253; H01L 51/524; H01L 51/52; H01L 2924/12044; H01L 51/50; H01L 23/10; H01L 51/0096; H01L 27/32; H01L 51/0001; H01L 21/67207; H01L 21/56; H01L 23/564; H01L 23/3121; H01L 27/1292; H01L 51/0024; H01L 21/76251; H01L 2224/838; H01L 51/44; H01L 23/3135; H01L 27/1262; H01L 51/10; H05B 33/04; H05B 33/02; H05B 33/0896
USPC .................................... 313/498–512; 445/25
See application file for complete search history.

(56) References Cited

U.S. PATENT DOCUMENTS

| 7,452,258 | B1* | 11/2008 | Marzen et al. ................... 445/25 |
| 2009/0218932 | A1* | 9/2009 | Wang .............................. 313/504 |
| 2009/0229745 | A1* | 9/2009 | Lee et al. ..................... 156/272.8 |
| 2010/0090596 | A1* | 4/2010 | Ota ................................. 313/512 |
| 2011/0260607 | A1* | 10/2011 | Liu et al. ........................ 313/512 |
| 2012/0025700 | A1* | 2/2012 | Ryu et al. ....................... 313/512 |

FOREIGN PATENT DOCUMENTS

| KR | 10-0657953 | 12/2006 |
| KR | 10-2012-0042474 | 5/2012 |

* cited by examiner

*Primary Examiner* — Donald Raleigh
(74) *Attorney, Agent, or Firm* — H.C. Park & Associates, PLC

(57) ABSTRACT

A display device according to an exemplary embodiment of the present invention includes a substrate, a display panel disposed on the substrate, a sealing substrate which is disposed opposite to the display panel, and a sealing unit disposed between the substrate and the sealing substrate, enclosing the display panel. The sealing unit has a penetration hole which passes through the sealing unit in a vertical direction.

15 Claims, 11 Drawing Sheets

DISPLAY APPARATUS AND METHOD OF MANUFACTURING THE SAME

CROSS REFERENCE TO RELATED APPLICATION

This application claims priority to and the benefit of Korean Patent Application No. 10-2013-0080551 filed in the Korean Intellectual Property Office on Jul. 9, 2013, which is hereby incorporated by reference for all purposes as if fully set forth herein.

BACKGROUND

1. Field

Exemplary embodiments of the present invention relate to a display device and a method of manufacturing a display device.

2. Discussion of the Background

Currently known display devices include liquid crystal displays (LCDs), plasma display panels (PDPs), organic light emitting diode (OLED) devices, field effect displays (FEDs), and electrophoretic display devices.

Particularly, organic light emitting diode (OLED) devices include two electrodes, and an organic emission layer disposed between the two electrodes. An electron that is injected from one electrode is coupled with a hole that is injected from another electrode on the organic emission layer to form an exciton. The exciton emits energy and light.

An organic light emitting diode (OLED) device has a self-luminance characteristic. Thus, unlike a liquid crystal display device, the OLED does not need a separate light source. Because of this characteristic, the thickness and weight of an OLED display may be reduced. Further, the organic light emitting diode device has desirable characteristics such as low power consumption, high luminance, and rapid response speed. Because of these characteristics, the OLED device draws industry attention as a next generation display device.

The above-described organic emission layer may be deteriorated due to external factors such as external moisture, gasses, and ultraviolet (UV) radiation. Thus, a packaging technology that seals and protects the organic emission layer is very important.

Referring to FIG. 1, a portable terminal including the OLED device uses a sealing substrate 10 and a sealing unit 20 to seal the organic emission layer. However, the sealing substrate 10 and the sealing unit 20 are vulnerable to an external impact. Therefore, the sealing substrate 10 or the sealing unit 20 may be damaged by external impact and moisture or gasses may permeate into the organic emission layer.

The above information disclosed in this Background section is only for enhancement of understanding of the background of the invention and therefore it may contain information that does not form the prior art that is already known in this country to a person of ordinary skill in the art.

BRIEF SUMMARY OF THE INVENTION

Exemplary embodiments of the present invention provide a display device that prevents a sealing unit which seals the display panel from being easily damaged due to the external impact and firmly couples a sealing substrate to a lower substrate.

Additional features of the invention will be set forth in the description that follows, and in part will be apparent from the description, or may be learned by practice of the invention.

Further, the present invention provides a method of manufacturing a display device which prevents a substrate and a sealing substrate from being separated from a sealing unit due to an external impact.

An exemplary embodiment provides a display device including: a substrate, a display panel which is disposed on the substrate, a sealing substrate which is disposed so as to be opposite to the display panel, and a sealing unit which is disposed between the substrate and the sealing substrate so as to enclose the display panel. The sealing unit has a penetration hole which passes through the sealing unit in a vertical direction.

Another exemplary embodiment of the present invention provides a method of manufacturing a display device including: forming a display panel which displays an image, on a substrate; disposing a mask on which a sealing pattern is formed, on the display panel; injecting a sealing material in the sealing pattern to form a sealing unit so as to enclose the display panel; removing the mask; and coupling the sealing substrate which is disposed so as to be opposite to the display panel to the sealing unit. The sealing pattern is formed such that a penetration hole which passes through the sealing unit in a vertical direction is formed in the sealing unit.

According to an exemplary embodiment of the present invention, a sealing unit which seals a display panel may be prevented from breakage derived from external impact and, thus, the display panel may be prevented from being deteriorated due to the permeated gasses or moisture.

According to the method of manufacturing a display device according to another exemplary embodiment, the sealing substrate and the substrate are firmly attached so that the sealing substrate and the substrate are prevented from being separated from each other and the damage of the sealing unit due to the external impact may be minimized.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
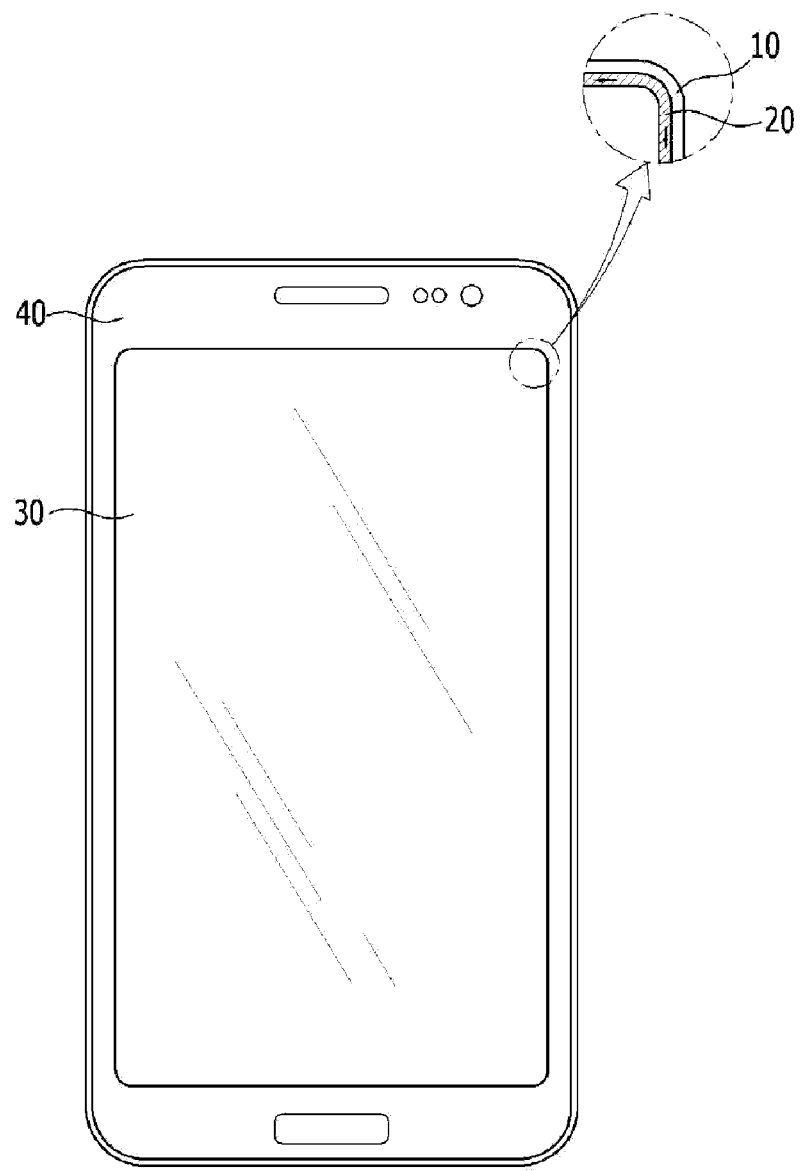
FIG. 1 is a diagram illustrating a portable terminal including a sealing substrate and a sealing material of the related art.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

Further, a size or a thickness of each component illustrated in the drawings is arbitrarily selected for better understanding and ease of description so that the present invention is not limited to the illustrated size or thickness.

In the drawings, the thickness of layers, films, panels, regions, etc., are exaggerated for clarity. Further, in the drawings, for better understanding and ease of description, a thickness of some layers and regions is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, the word "on" means positioning on or below the object portion, but does not essentially mean positioning on the upper side of the object portion based on a gravity direction.

Figure 2:
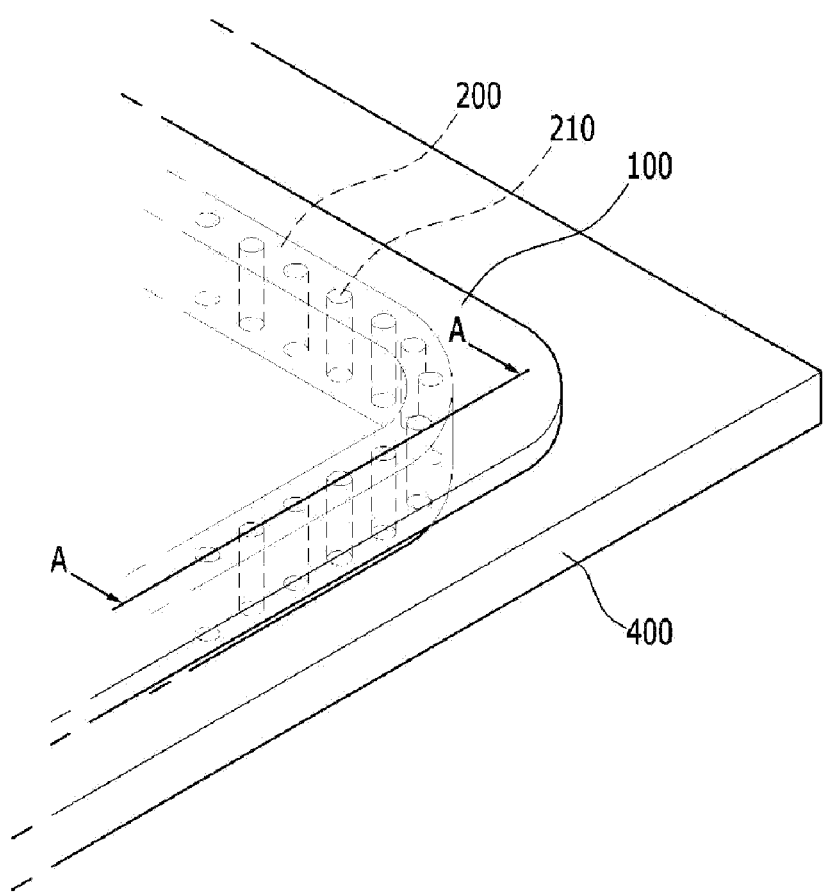
FIG. 2 is a partial perspective view illustrating a display device according to an exemplary embodiment.
Figure 3:
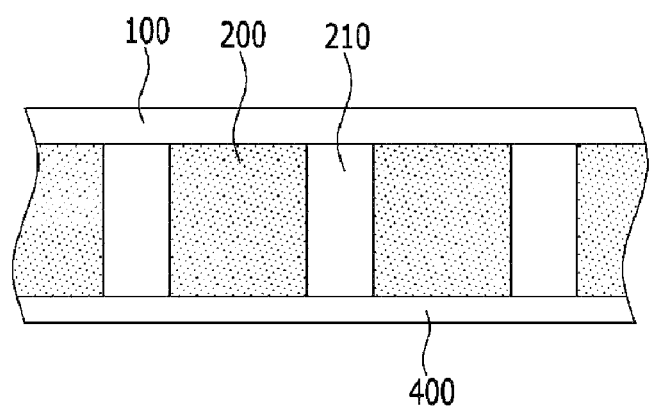
FIG. 3 is a cross-sectional view taken along the line A-A of FIG. 2.

Referring to FIGS. 2 and 3, in a display device according to an exemplary embodiment, a substrate 400 and a sealing substrate 100 are firmly coupled to each other by a sealing unit 200 having a penetration hole 210 therein and the external impact is dispersed by the penetration hole 210 so that the damage of the sealing unit 200 is prevented.

The display device according to an exemplary embodiment may include a substrate 400, a display panel 300, the sealing substrate 100, and the sealing unit 200.

Figure 5:
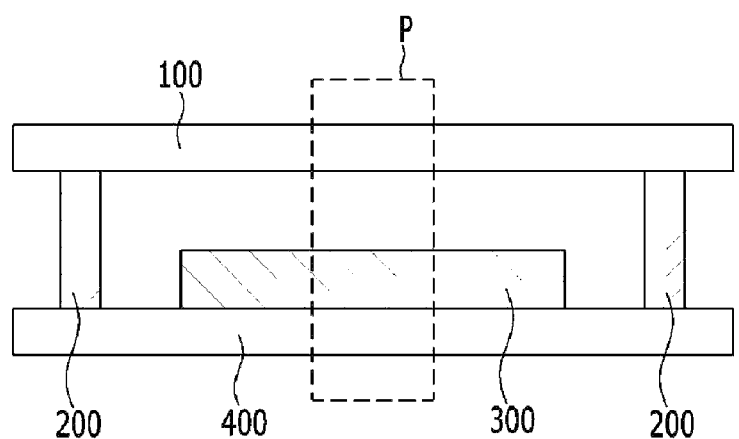
FIG. 5 is a cross-sectional view of a display device according to an exemplary embodiment.

Referring to FIGS. 2 and 5, the substrate 400 is a base layer on which the display panel 300 is formed in a general display device.

In this case, the substrate 400 may be formed of an insulating material, such as glass, quartz, ceramic, or plastic. However, the substrate 400 is not limited thereto, but may be formed of a metallic material, such as stainless steel.

The display panel 300 according to an exemplary embodiment of the present invention displays an image. In this case, the display panel 300 includes an organic emission layer, which will be described below in detail.

In this exemplary embodiment, the display panel 300 includes an organic emission layer that may be used for an organic light emitting diode (OLED) device. However, the display device according to the exemplary embodiment is not limited to the organic light emitting diode (OLED) device, but may be applied to a liquid crystal display (LCD), a field effect display device, an electrophoretic display device, or any other type of display device that might be sealed.

In this exemplary embodiment, sealing substrate 100 seals the display panel 300 and is disposed on the display panel 300. The sealing substrate 100 protects the display panel 300 from external moisture or gasses together with the sealing unit 20, which will be described below. Particularly, the sealing substrate 100 prevents the organic emission layer of the display panel 300 from becoming deteriorated due to the moisture or gasses.

In this exemplary embodiment, the sealing substrate 100 may be formed of various materials. Specifically, sealing substrate 100 may be formed of a glass material or a plastic material.

Referring to FIGS. 2 and 3, the sealing unit 200 is disposed between the sealing substrate 100 and the substrate 400. Referring to FIG. 5, the sealing unit 200 is disposed at a circumference of the display panel 300, enclosing the display panel 300.

Sealing unit 200 is coupled to the sealing substrate 100 and the substrate 400. The sealing unit 200 may be formed of a material containing frit. However, the sealing unit 200 is not limited thereto, but may be formed of various materials that are capable of coupling the sealing substrate 100 and the substrate 400.

According to the exemplary embodiment, the penetration hole 210 may be formed in the sealing unit 200. As illustrated in FIGS. 2 and 3, the penetration hole 210 is formed in a vertical direction, passing through the sealing unit 200. Here, the vertical direction is a direction in which the substrate 400 and the sealing substrate 100 are connected with respect to the sealing unit 200, where both ends of the penetration hole 210 are coupled to the substrate 400 and the sealing substrate 100, respectively. Specifically, an upper end of the penetration hole 210 is coupled to the sealing substrate 100, and a lower end of the penetration hole 210 is coupled to the substrate 400. In this case, both ends of the penetration hole 210 are tightly adhered to the sealing substrate 100 and the substrate 400, respectively, so that gas such as air cannot enter the penetration hole 210.

A vacuum may be formed inside of the penetration hole 210. The both ends of the penetration hole 210 are tightly adhered to the sealing substrate 100, respectively, and the substrate 400 to maintain the vacuum formed in the penetration hole 210.

Below, an exemplary embodiment of a method that tightly adheres the penetration hole 210 to the sealing substrate 100 and the substrate 400 so as to form the vacuum in the penetration hole 210 will be described According to the exemplary embodiment, when the vacuum is formed in the penetration hole 210, the sealing unit 200 is firmly coupled to the sealing substrate 100 and the substrate 400. That is, coupling forces between the sealing unit 200 and the sealing substrate 100 and between the sealing unit 200 and the substrate 400 are improved.

Further, when the penetration hole 210 is formed in the sealing unit 200, the impact transferred from the outside may be dispersed.

Figure 4:
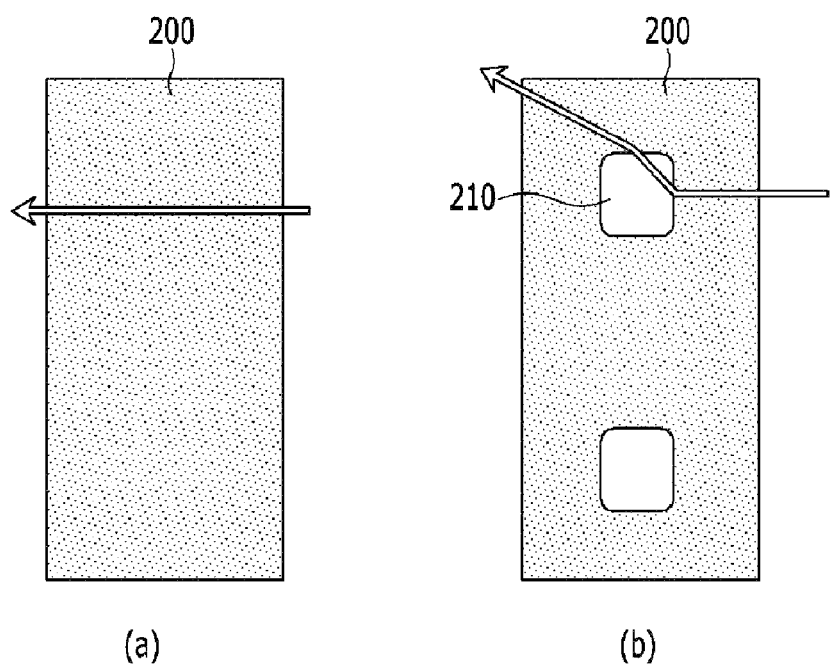
FIG. 4 illustrates a path through which an external impact is transmitted to the sealing units of FIG. 1 and FIG. 2.

Referring to FIG. 4A, if the penetration hole is not formed in the sealing unit 200, the external impact may be directly transferred to an internal direction of the display panel. In contrast, as illustrated in FIG. 4B, when the penetration hole 210 is formed in the sealing unit 200, the transferring path of the external impact may be changed. Thus, there are more transferring paths of the external impact, so the external impact may be lessened when being transferred.

Referring to FIG. 2, a cross-section of the penetration hole 210 of the sealing unit 200 may be a circular shape.

However, the cross-sectional shape of the penetration hole 210 is not limited thereto. The cross-sectional shape of the penetration hole 210 may also be polygonal. For example, the penetration hole 210 may be formed to have shapes such as triangular, quadrangular, or pentagonal.

According to an exemplary embodiment of the present invention, a plurality of penetration holes 210 may be formed in the sealing unit 200. Referring to FIG. 2, a plurality of penetration holes 210 may be formed in the sealing unit 200 along a circumference of the display panel. When the plurality of penetration holes 210 are formed, the external impact may be easily dispersed, even when the external impact is transferred in an arbitrary direction.

Further, when the plurality of penetration holes 210 is formed, the sealing unit 200 may be more firmly coupled to the sealing substrate 100 and the substrate 400. That is, the coupling forces between the sealing unit 200, the sealing substrate 100, and the substrate 400 may be further improved.

According to the exemplary embodiment, the sealing unit 200 may be formed of frit. However, the sealing unit 200 is not limited thereto, but may be formed of various materials that are capable of coupling the sealing substrate 100 and the substrate 400 and sealing the display panel.

Figure 6:
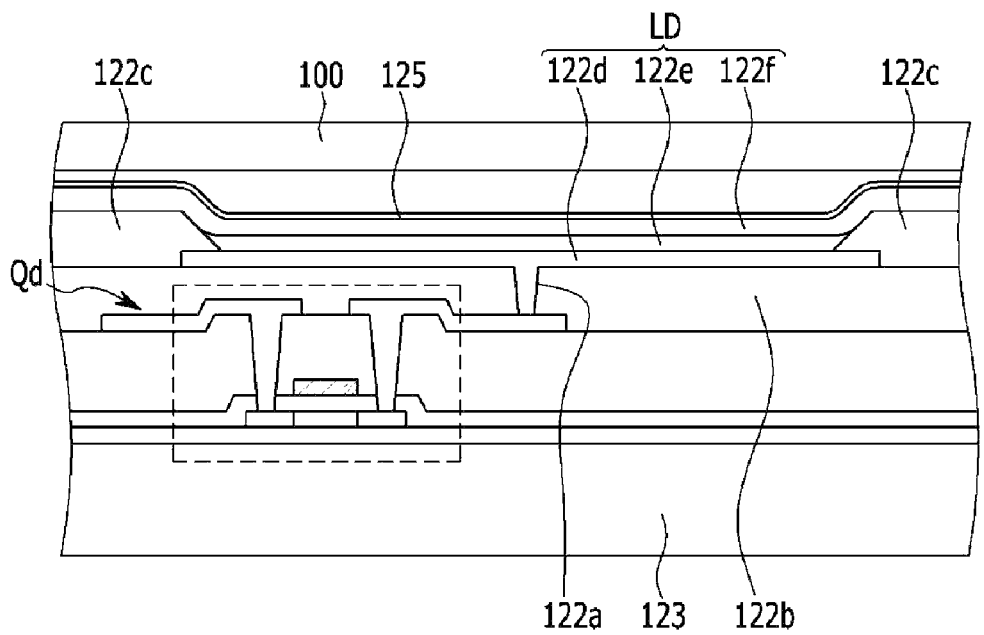
FIG. 6 is an enlarged view of a region P of FIG. 5.

FIG. 6 is an exploded cross-sectional view of the display panel in which a region P of FIG. 5 is illustrated in detail.

Referring to FIG. 6, the display device according to the exemplary embodiment, particularly, an organic light emitting diode (OLED) device will be described in detail.

Referring to FIG. 6, the driving transistor Qd is formed on display substrate 123 which, in turn, may be formed of transparent glass or plastic. In this case, the display substrate 123 corresponds to the substrate 400 of FIG. 5.

Further, a protective layer 122b which may be formed of an inorganic material or an organic material is formed on a driving transistor Qd. When the protective layer 122b is formed of the organic material, the surface may be flat.

A via hole 122a may be formed in the protective layer 122b so as to expose a part of the driving transistor Qd.

A first electrode 122d may be formed on the protective layer 122b. The first electrode 122d may include a reflective electrode and a transparent electrode formed on the reflective electrode. The reflective electrode may be formed of a material having a high reflectivity such as silver (Ag), aluminum (Al), or an alloy thereof, and the transparent electrode may be formed of transparent conductive oxide such as ITO (indium tin oxide) or IZO (indium zinc oxide).

In this case, a pixel definition layer 122c is formed on the protective layer 122b to cover a circumference of an edge of the first electrode 122d.

Referring to FIG. 6, an organic emission layer 122e may be formed on the first electrode 122d. A second electrode 122f may be formed on the organic emission layer 122e and the pixel definition layer 122c.

The organic emission layer 122e may further include organic layers (not illustrated) which efficiently transfer a carrier such as a hole or an electron to the emission layer in addition to the emission layer (not illustrated) which actually emits light. The organic layers may include a hole injection layer and a hole transport layer disposed between the first electrode 122d and the emission layer. The organic layers may further include an electron injection layer and an electron transport layer disposed between the second electrode 122f and the emission layer.

Further, a capping layer 125 that covers and protects the second electrode 122f may be formed on the second electrode 122f. The capping layer 125 may be formed of an organic layer.

According to the exemplary embodiment, the sealing substrate 100 may be spaced apart from the capping layer 125.

Various layers disposed between the display substrate 123 and the sealing substrate 100 in FIG. 6 may correspond to the display panel 300 (see FIG. 5) which displays an image.

Figure 7:
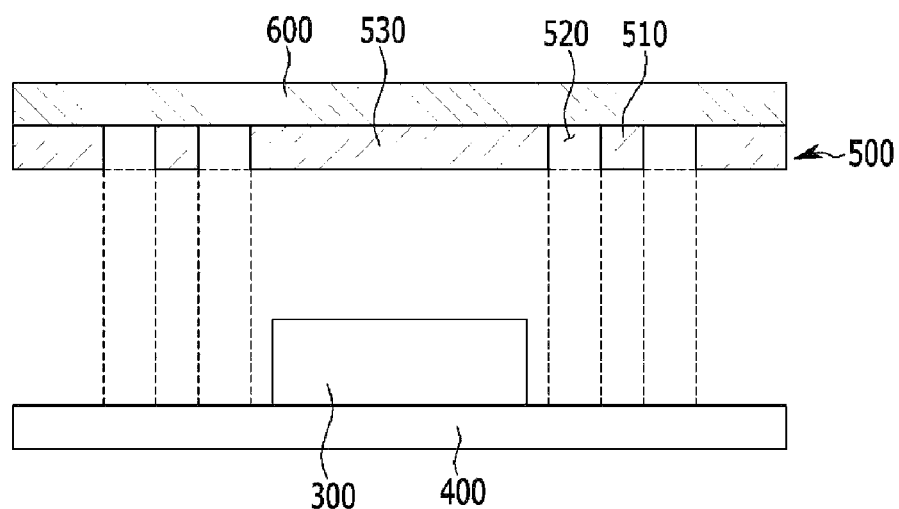
FIGS. 7 and 8 illustrate a manufacturing process of a display device according to an exemplary embodiment.
Figure 8:
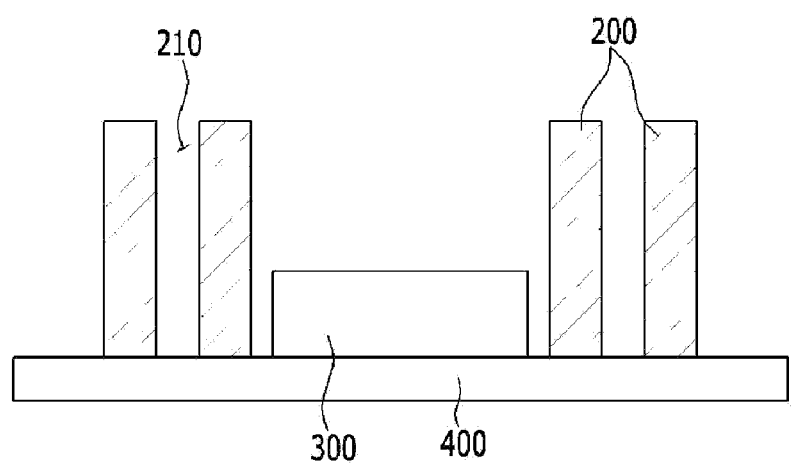
Figure 10:
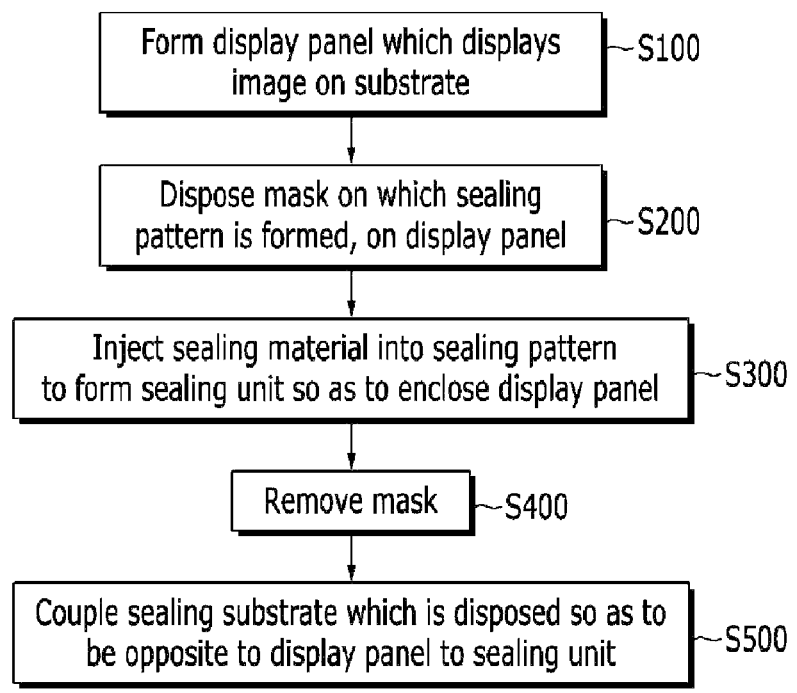
FIG. 10 is a flowchart illustrating a method of manufacturing a display device according to an exemplary embodiment of the present invention.

FIGS. 7 and 8 sequentially illustrate a method of manufacturing a display device according to an exemplary embodiment, and FIG. 10 is a flowchart illustrating the method of manufacturing a display device. Hereinafter, a method of manufacturing a display device will be described in detail.

The method of manufacturing a display device according to an exemplary embodiment may include forming a penetration hole 210 which is in a vacuum status in a sealing unit 200 to enforce the coupling force between a sealing substrate 100, a substrate 400, and a sealing unit 200.

First, referring to FIGS. 7 and 10, in step S100, a display panel 300 is formed on the substrate 400. In this case, the display panel 300 may include a driving transistor and an organic emission layer. A known process that forms the driving transistor or the organic emission layer is included in a process that forms the display panel 300 on the substrate 400 so that detailed description thereof will not be provided.

Next, in step S200, a mask 500 on which a sealing pattern is formed is disposed on the display panel 300. In this case, the mask 500 is used during injection of a sealing material 600 to form the sealing unit 200 and the sealing pattern for a specific shape of the sealing unit 200 is formed on the mask 500. Here, the sealing pattern refers to a pattern that is formed on the mask so as to form a penetration hole 210 in the sealing unit 200.

Figure 9:
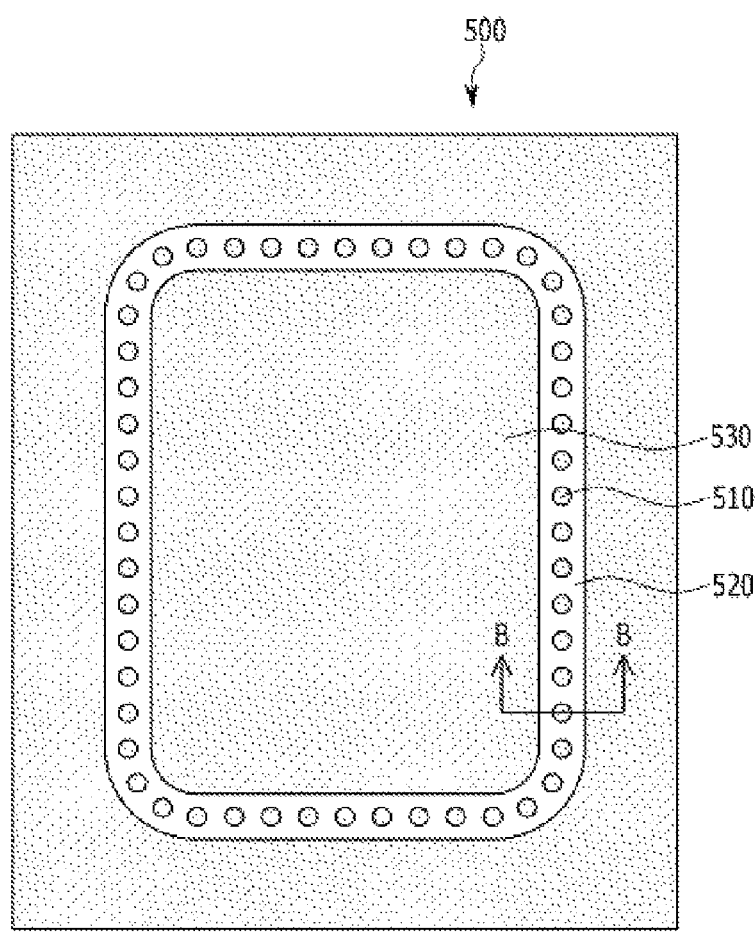
FIG. 9 is a top plan view of a mask which is used in a manufacturing process of a display device according to an exemplary embodiment.

FIG. 9 is a top plan view illustrating the mask 500 on which the sealing pattern is formed. As illustrated in FIG. 9, a penetration hole region 510 and a sealing unit region 520 are formed in the mask 500.

In this case, the sealing unit region 520 is a region that is provided for the injected sealing material 600 to form the sealing unit 200 on the substrate 400. When the sealing material 600 passes through the sealing unit region 520 to be held in the substrate 400, the sealing unit 200, which encloses the display panel 300, is formed.

Further, the penetration hole region 510 blocks the sealing material 600 from penetrating the mask 500, thereby forming the penetration hole 210 in the sealing unit 200. By doing this, the penetration hole 210, which passes through the inside of the sealing unit 200 in a vertical direction, is formed.

The display panel region 530 blocks the sealing material 600 from penetrating the mask 500 in a region corresponding to the display panel 300.

Figure 11:
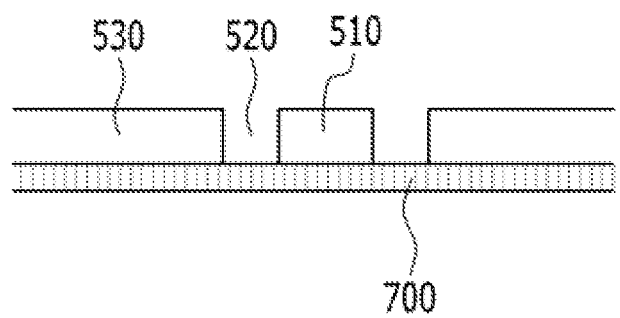
FIG. 11 is a cross-sectional view taken along the line B-B of FIG. 9.

In this case, as shown in FIG. 11, a supporting plate for mask 700 is disposed under the mask 500. The supporting plate for mask 700 supports the penetration hole region 510 and the display panel region 530 to be fixed. Further, the supporting plate for mask 700 is composed of mesh so that the sealing material 600 can penetrate the supporting plate for mask 700.

Next, the sealing material 600 is injected in the sealing pattern to form the sealing unit 200 in step S300.

In this case, a step S300 of forming the sealing unit 200 is divided into a step of applying the sealing material 600 onto the mask 500 and a step of pressurizing the sealing material 600.

Referring to FIG. 7, after disposing the mask 500 on the display panel 300, the sealing material 600 is applied on the mask 500. Alternatively, before disposing the mask 500 on the display panel 300, the sealing material 600 may be applied on the mask 500 in advance. That is, the mask 500 on which the sealing material 600 is applied in advance may be disposed on the display panel 300.

Next, the sealing material 600 is pressurized to inject the sealing material 600 onto the substrate 400 along the sealing pattern. In this case, referring to FIG. 8, the penetration hole 210 may be formed in the sealing unit 200 by the penetration hole region 510 of the mask 500.

Next, when the sealing unit 200 is completely formed, the mask 500 is removed in step S400.

After removing the mask 500, the sealing substrate 100 is coupled to the sealing unit 200, sealing the display panel 300 in step S500.

In this case, a step of coupling the sealing substrate 100 to the sealing unit 200 may include a step of bringing the sealing substrate 100 into contact with a top surface of the sealing unit 200 and a step of heating the sealing unit 200.

In order to couple the sealing substrate 100 to the sealing unit 200, first, the sealing substrate 100 may be brought into contact with on a top surface of the sealing unit 200. Next, the sealing unit 200 is heated.

In this case, after heating the sealing unit 200, if the sealing unit 200 is cooled down, a vacuum is formed in the penetration hole 210. In other words, the sealing material 600 which configures the sealing unit 200 is heated and then shrinks to form a vacuum in the penetration hole 210.

As the vacuum is formed in the penetration hole 210, the sealing substrate 100 is firmly adhered to the sealing unit 200. Similarly, the substrate 400 is also firmly adhered to the sealing unit 200.

A method of cooling the sealing unit 200 after heating the sealing unit 200 may be performed by a natural cooling method. However, in consideration of a strength of the sealing unit 200, and a degree of vacuum of the penetration hole 210, a cooling time of the sealing unit may be adjusted by a separate cooling device to cool down the sealing unit 200.

According to a display device and a manufacturing method thereof according to the exemplary embodiment, the sealing unit of the display device may be prevented from being easily damaged and the sealing substrate and the substrate are firmly attached to the sealing unit.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a substrate;
a display panel disposed on the substrate;
a sealing substrate disposed opposite the display panel; and
a sealing unit disposed between the substrate and the sealing substrate, the sealing unit enclosing the display panel,
wherein the sealing unit has penetration holes that pass through the sealing unit, and
wherein each of the penetration holes is completely enclosed by the sealing unit, the substrate, and the sealing substrate.

2. The display device of claim 1, wherein:
respective ends of each of the penetration holes expose a surface of the substrate and a surface of the sealing substrate.

3. The display device of claim 2, wherein:
a vacuum is formed in each of the penetration holes.

4. The display device of claim 1, wherein:
a cross-sectional shape of each of the penetration holes is a circle.

5. The display device of claim 1, wherein:
a cross-sectional shape of each of the penetration holes is a polygon.

6. The display device of claim 1, wherein:
the sealing unit comprises a frit.

7. A method of manufacturing a display device, comprising:
forming a display panel on a substrate;
passing a sealing material through a mask comprising a sealing pattern to form a sealing unit surrounding the display panel; and
coupling a sealing substrate with the sealing unit,
wherein the sealing pattern is formed such that penetration holes, passing through the sealing unit in a vertical direction, are formed in the sealing unit.

8. The method of claim 7, wherein:
passing the sealing material through the mask comprises:
applying the sealing material on the mask; and
pressurizing the sealing material to inject the sealing material into the sealing pattern.

9. The method of claim 7, wherein:
coupling the sealing substrate includes:
contacting the sealing substrate with a top surface of the sealing unit; and
heating the sealing unit after the sealing substrate is contacted with the top surface.

10. The method of claim 9, further comprising:
cooling down the sealing unit after heating the sealing unit.

11. The method of claim 10, wherein
the cooling comprises natural cooling.

12. The method of claim 10, wherein
the cooling comprises cooling using a separate cooling device.

13. The method of claim 7, further comprising:
forming a vacuum in each of the penetration holes.

14. The method of claim 13, wherein
forming the vacuum in each of the penetration holes comprises heating the sealing unit and
cooling down the sealing unit after heating the sealing unit.

15. The display device of claim 1, wherein
the sealing unit is disposed outside of the display panel and completely surrounds the display panel, and
the penetration holes are disposed outside of the display panel.

* * * * *